US008580881B2

(12) United States Patent
Phillips et al.

(10) Patent No.: US 8,580,881 B2
(45) Date of Patent: *Nov. 12, 2013

(54) COATING COMPOSITIONS

(75) Inventors: Richard J. Phillips, St. Peters, MO (US); Steven L. Kimbel, St. Charles, MO (US); Aditya J. Deshpande, Chesterfield, MO (US); Gang Shi, O'Fallon, MO (US)

(73) Assignee: MEMC Singapore Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/473,347

(22) Filed: May 16, 2012

(65) Prior Publication Data
US 2012/0252950 A1 Oct. 4, 2012

Related U.S. Application Data

(63) Continuation of application No. 12/837,873, filed on Jul. 16, 2010, now Pat. No. 8,211,965.

(60) Provisional application No. 61/226,172, filed on Jul. 16, 2009, provisional application No. 61/226,175, filed on Jul. 16, 2009, provisional application No. 61/226,176, filed on Jul. 16, 2009.

(51) Int. Cl.
*C08K 3/34* (2006.01)

(52) U.S. Cl.
USPC ............. 524/443; 428/98; 264/332; 264/219; 427/230; 427/236; 423/348

(58) Field of Classification Search
USPC ..................... 524/443; 428/98; 264/332, 219; 427/230; 423/348
See application file for complete search history.

(56) References Cited

U.S. PATENT DOCUMENTS

| | | | |
|---|---|---|---|
| 3,660,075 A | 5/1972 | Harbur et al. | |
| 3,746,569 A | 7/1973 | Pammer et al. | |
| 4,741,925 A | 5/1988 | Chaudhuri et al. | |
| 5,431,869 A | 7/1995 | Kumar et al. | |
| 5,480,846 A | 1/1996 | Sundberg et al. | |
| 6,165,425 A | 12/2000 | Lange et al. | |
| 6,491,971 B2 | 12/2002 | Costantini et al. | |
| 8,211,965 B2 * | 7/2012 | Phillips et al. | 524/443 |
| 2006/0219162 A1 | 10/2006 | Parthasarathy et al. | |
| 2007/0169685 A1 | 7/2007 | Stoddard | |
| 2009/0119882 A1 * | 5/2009 | Uibel | 23/295 R |
| 2009/0159230 A1 | 6/2009 | Tsuchida et al. | |

FOREIGN PATENT DOCUMENTS

| | | |
|---|---|---|
| DE | 19908764 A1 | 9/1999 |
| EP | 0419846 A2 | 4/1991 |
| EP | 0748885 A1 | 12/1996 |
| EP | 1739209 A1 | 1/2007 |
| EP | 2025780 A2 | 2/2009 |
| JP | 2006198677 A | 8/2006 |
| WO | 2004013384 A1 | 2/2004 |
| WO | 2008118023 A1 | 10/2008 |

OTHER PUBLICATIONS

Aparicio et al., JECS 19 (1999) 1717-1724.*
Gutierrez et al., "Tape casting of non-aqueous silicon nitride slips," Journal of the European Ceramic Society, 20(10): 1527-1537 (Sep. 1, 2000).
Hotta et al., "Origin of the strength change of silicon nitride ceramics with the alteration of spray drying conditions," Journal of the European Ceramic Society, 21(5) 603-610 (May 1, 2001).
Partial European Search Report received for related Application No. 12186832.7, issued Jan. 30, 2013 (10 pages).
Examination Report received in related EP Application No. 10737702.0, issued Jan. 30, 2013 (7 pages).
Non-Final Rejection received in related U.S. Appl. No. 12/837,876, issued Nov. 30, 2012 (38 pages).
Aparicio et al., "Colloidal Stability and Sintering of Yttria-Silica and Yttria-Silica-Alumina Aqueous Suspensions," M. European Ceramic Society, 19: 1717-1724 (1999).
Camuscu et al., "Effect of Starting Composition, Type of Rare Earth Sintering Additive and Amount of Liquid Phase on α • β Sialon Transformation," J. European Ceramic Society, 17: 599-613 (1997).
Damiani et al., "Light Induced Degradation in Promising Multi-Crystalline Silicon Materials for Solar Cell Fabrication," Presented at the 3rd World Conference on Photovoltaic Energy Conversion, Osaka, Japan, May 11-18, 2003; University Center of Excellence for Photovoltaics Conference Papers, 6 pages (May 2003).
Dhamrin et al., "Light-Induced Lifetime Degradation of Multicrystalline Silicon Wafers and Solar Cells," Solid State Phenomena 93: 147-152 (2003).
Geyer et al., "The Development of Silicon-Nitride Crucibles for Melting and Crystallization of Multicrystalline Silicon," 20th European Photovoltaic Solar Energy Conference, Jun. 6-10, 2005, Barcelona, Spain, pp. 963-964.
Hashigami et al., "Effect of Illumination Conditions on Czochralski—Grown Silicon Solar Cell Degradation," J. Applied Physics, 93(7): 4240-4245 (2003), Abstract Only.

(Continued)

*Primary Examiner* — Robert D. Harlan
(74) *Attorney, Agent, or Firm* — Armstrong Teasdale LLP

(57) ABSTRACT

Silicon nitride coated crucibles for holding melted semiconductor material and for use in preparing multicrystalline silicon ingots by a directional solidification process; methods for coating crucibles; methods for preparing silicon ingots and wafers; compositions for coating crucibles and silicon ingots and wafers with a low oxygen content.

22 Claims, 5 Drawing Sheets

(56) References Cited

OTHER PUBLICATIONS

Henker et al., "The Development of Silicon-Nitride Crucibles for Melting and Crystallisation of Multicrystaline Silicon," 21st European Photovoltaic Solar Energy Conference, Sep. 4-8, 2006, Dresden, Germany, pp. 1009-1011.

Hirosaki et al., Sintering of Si3N4 with the Addition of Rare-Earth Oxides, J. American Ceramic Society, 71(3): C-144-C-147 (1988).

Saito et al., "A Reusable Mold in Directional Solidification for Silicon Solar Cells," Solar Energy Materials, 9: 337-345 (1983).

Saito et al., "A New Directional Solidification Technique for Polycrystalline Solar Grade Silicon," NASA ADS, In 15th Photovoltaic Specialists Conference, Kissimmee, Florida, May 12-15, 1981, Conference Record (A82-44928 23-44); New York, Institute of Electrical and Electronics Engineers, pp. 576-580 (1981).

Stokkan et al., "Influence of Nucleation and Contamination from Crucible and Coating on Dislocation Density and Lifetime of Multicrystalline Silicon," 22nd European Photovoltaic Solar Energy Conference, Sep. 3-7, 2007, Milan, Italy, pp. 1389-1393.

Invitation to Pay Additional Fees issued in Analogous Application Serial No. PCT/US2010/042309 dated Sep. 20, 2010, (10 pages).

* cited by examiner

COATING COMPOSITIONS

CROSS-REFERENCE TO RELATED APPLICATIONS

The present application is a continuation of U.S. patent application Ser. No. 12/837,873, filed Jul. 16, 2010, which claims the benefit of U.S. Provisional Application No. 61/226,175, filed Jul. 16, 2009, U.S. Provisional Application No. 61/226,176, filed Jul. 16, 2009 and U.S. Provisional Application No. 61/226,172, filed Jul. 16, 2009, each of which is incorporated herein by reference in its entirety.

BACKGROUND

The field of the disclosure relates to coated crucibles for holding melted semiconductor material and, particularly, for use in preparing multicrystalline silicon ingots by a directional solidification process. Other aspects include methods for coating crucibles, methods for preparing silicon ingots and wafers, compositions for coating crucibles and silicon ingots and wafers with a low oxygen content.

Conventional photovoltaic cells, used for the production of solar energy, utilize multicrystalline silicon. Multicrystalline silicon is conventionally produced in a directional solidification (DS) process in which silicon is melted in a crucible and directionally solidified in a separate or in the same crucible. The solidification of the ingot is controlled such that molten silicon solidifies unidirectionally at the solidifying front of the casting. The multicrystalline silicon produced in such a manner is an agglomeration of crystal grains with the orientation of the grains being random relative to each other due to the high density of heterogeneous nucleation sites at the crucible wall. Once the multicrystalline ingot is formed, the ingot may be cut into blocks and further cut into wafers. Multicrystalline silicon is generally the preferred silicon source for photovoltaic cells rather than single crystal silicon due to its lower cost resulting from higher throughput rates, less labor-intensive operations and the reduced cost of supplies as compared to typical single crystal silicon production.

During and after solidification, the solidified ingot must be released from the crucible without causing cracking of the ingot. Conventional crucibles are constructed of formed and sintered silica or fused-silica (synonymously "quartz"), silicon nitride or graphite. Silicon nitride crucibles may be reused but are typically more expensive relative to other crucibles. Crucibles may be coated with various coating materials; however, these processes and the resulting coated crucibles have been found to be deficient.

SUMMARY

One aspect of the present disclosure is directed to a composition for coating the inner surface of a crucible to improve an ingot-release characteristic of the crucible. The composition includes a medium, silicon nitride, binder and a sintering agent.

In another aspect, a composition for coating the inner surface of a crucible to improve an ingot-release characteristic of the crucible includes a medium, silicon nitride, dispersant and a binder to enhance adhesion of the coating to the crucible.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Applicants have found that by coating a crucible such as, for example, a silica crucible, with a coating composition of sufficient thickness that contains minimal sources of oxygen, multicrystalline ingots and wafers with a reduced oxygen content and correspondingly reduced light induced degradation may be produced. Further, oxygen-containing sintering aids may be used in various coating compositions applied to the crucible. A first area of the crucible body may be coated with a coating composition that does not contain the sintering aid and a second area coated with a composition that does contain the sintering aid to minimize the surface area of the crucible exposed to oxygen.

By controlling the amount of oxygen in the coating compositions, the resulting ingots have been found to be characterized by a beneficial oxygen profile as compared to conventional processing methods and coatings. It has been found that lower oxygen levels may be achieved in the ingot which is desirable in, for example, boron-doped solar silicon. High oxygen levels in boron-doped solar silicon have been associated with light-induced degradation over time.

Crucible Body Starting Material

Figure 1:
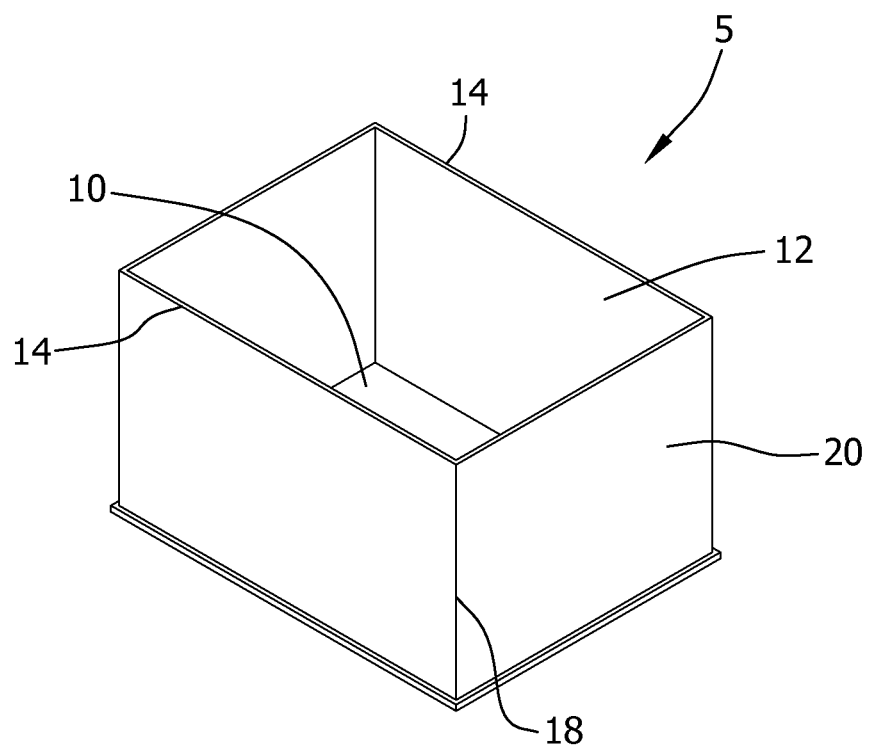
FIG. 1 is a perspective view of a crucible body according to one embodiment of the present disclosure.

Referring now to FIG. 1, a crucible body for use in embodiments of the present disclosure is generally designated as numeral 5. The crucible body 5 has a bottom 10 and a sidewall 14 that extends from the base or bottom 10. While the crucible body 5 is illustrated with four sidewalls 14 being shown, it should be understood that the crucible body 5 may include fewer than four sidewalls or may include more than four sidewalls without departing from the scope of the present disclosure. Also, the corners 18 between sidewalls 14 may be connected to each other at any angle suitable for forming the enclosure of the crucible body and may be sharp as illustrated in FIG. 1 or may be rounded. In some embodiments, the crucible body has one sidewall that is generally cylindrical in shape. The sidewalls 14 of the crucible body 5 have an inner surface 12 and an outer surface 20. The crucible body 5 is generally open, i.e., the body may not include a top. It should be noted, however, that the crucible body 5 may have a top (not shown) opposite the bottom 10 without departing from the scope of the present disclosure.

In several embodiments of the present disclosure, the crucible body 5 has four sidewalls 14 of substantially equal length (e.g., the crucible has a generally square base 10). The length of the sidewalls 14 may be at least about 25 cm, at least about 50 cm or even at least about 75 cm. The height of the sidewalls 14 may be at least about 15 cm, at least about 25 cm or even at least about 35 cm. In this regard, the volume of the crucible (in embodiments wherein a square or rectangular base is used or wherein the crucible is cylindrical or round or in embodiments wherein another shape is used) may be at least about 0.05 $m^3$, at least about 0.15 $m^3$ or at least about 0.25 $m^3$). Further in this regard, it should be understood that crucible shapes and dimensions other than as described above may be used without departing from the scope of the present disclosure. In one or more particular embodiments of the present disclosure, the crucible body 5 has four sidewalls 14 that are each about 87.7 cm in length and 40 cm in height and the crucible has a volume of about 0.31 $m^3$.

The crucible body 5 may be constructed of any material suitable for the solidification of semiconductor material. For example, the crucible may be constructed from a material selected from silica, silicon nitride, silicon carbide, graphite, mixtures thereof and composites thereof. Composites may include, for example, a base material with a coating thereon. Composite materials include, for example, silica coated with silicon nitride and graphite coated with calcium chloride and/or silicon nitride. It should be noted that some crucible body materials may not inherently be a source of oxygen contamination (e.g., graphite), however they may have other attributes to be taken into consideration when designing a system (e.g., cost, contamination and the like). In addition, the material preferably is capable of withstanding temperatures at which such semiconductor material is melted and solidified. For example, the crucible material is suitable for melting and solidifying semiconductor material at temperatures of at least about 300° C., at least about 1000° C. or even at least about 1580° C. for durations of at least about 10 hours or even as much as 100 hours or more.

The thickness of the bottom 10 and sidewalls 14 may vary depending upon a number of variables including, for example, the strength of material at processing temperatures, the method of crucible construction, the semiconductor material of choice and the furnace and process design. Generally, the thickness of the crucible may be from about 5 mm to about 50 mm, from about 10 mm to about 40 mm or from about 15 mm to about 25 mm.

Coating Compositions

At least a portion of the inner surface 12 of the sidewalls 14 of the crucible body 5 described above may be coated with a coating composition including silicon nitride and one or more additives and of a sufficient thickness to reduce the amount of oxygen in an ingot subsequently formed in the crucible and/or to enhance an ingot-release characteristic of the crucible. The additive may be, for example, one or more of binders, dispersants, sintering aids and a medium, diluent, solvent or combinations thereof. Ingot-release characteristics include the ability of the ingot to release the ingot during cooling (i.e., ability of the crucible not to adhere to the ingot) and to release the ingot without causing ingot cracking. Evidence of ingot adhesion includes, for example, (1) a failure of the ingot to release from the crucible even at room temperatures, (2) the amount of ingot cracking upon release and/or (3) the presence and amount of semiconductor material stuck to the crucible after release of the ingot.

The composition may include at least about 5% by weight silicon nitride and, in other embodiments, at least about 15% by weight or even at least about 30% by weight silicon nitride. In various embodiments, the coating composition may include from about 5% to about 50% by weight silicon nitride, from about 15% to about 50% by weight, from about 10% to about 40% by weight or from about 30% to about 40% by weight silicon nitride. In some embodiments, the coating composition includes from about 37.0 to 37.7% by weight silicon nitride. For purposes of the present disclosure, percent inclusion of components of the "coating composition" or simply "composition" refer to the material applied to the crucible body and not the coating itself which forms after additional processing steps (e.g., vaporization of mediums, heating, or sintering, etc.). Percent inclusion of the components of the "coating" (described below under the section entitled "Coated Crucibles") refer to the solid material covering a portion of the crucible body after all processing steps are performed and that covers the crucible body during preparation of an ingot. Unless described otherwise, listed percentages are given as the percentage of the entire composition or entire coating including the component or components being described.

Without being bound by a particular theory, it is believed that when used in particulate form, the size of the silicon nitride particles can affect the rheology of the coating composition and affect the ease of application. In some embodiments, the average nominal diameter of the particulate silicon nitride may be less than about 100 µm. In other embodiments, the average nominal diameter of the silicon nitride may be less than about 50 µm, less than about 25 µm or even less than about 10 µm. Utilization of smaller particle sizes generally results in coating compositions with improved fluidity.

The composition may include a medium in which the silicon nitride remains substantially in particulate form. Generally, it should be understood that one or more of the silicon nitride and additives such as a binder, dispersant, sintering aid and the like may not dissolve, partially dissolve or fully dissolve in the medium and the terms "medium," "diluent," and "solvent" may be used interchangeably and are not meant to limit embodiments of the present disclosure to compositions wherein one or more components do or do not dissolve in the medium.

The medium may include an organic compound or may be aqueous. It should be noted, however, that the presence of water in an aqueous solution may result in more oxygen in the cured coating which may also result in an increase in the oxygen level of a semiconductor ingot grown therein. Thus, while aqueous solutions may be utilized without departing from the present disclosure, it may be preferable in some embodiments to use a non-aqueous medium. Preferably the medium vaporizes readily during any drying steps.

The medium may include a C1 to C10 alcohol and may be isopropyl alcohol or ethanol. In some embodiments, at least about 10% by weight of the total composition prior to being applied to the crucible is the medium.

In other embodiments, the composition may include at least about 30%, at least about 50% or even at least about 70% by weight medium. In various other embodiments, the composition includes from about 10% to about 80% by weight medium, from about 30% to about 70%, from about 40% to about 60% or even from about 45% to about 55% by weight medium. The composition may include from about 47.9% to about 50.6% by weight medium. The composition may include more than one medium with the total weight fraction of medium in the composition being as described above.

The composition may include one or more binders which act to bind the coating and, more particularly, the silicon nitride particles, to the crucible body and to each other after application. Generally, the binder alters the rheology of the coating composition and maintains the distribution of particles in the medium throughout application and drying. In some embodiments, the binder is dissolved in the medium. In some embodiments, the binder is polyvinyl butyral, such as B-76 available from Solutia, Inc. (St. Louis, Mo.). In some embodiments, at least about 0.5%, at least about 2%, at least about 5% or at least about 10% or even at least about 15% by weight of the total composition prior to being applied to the crucible is one or more binders. In various embodiments, the composition includes from about 0.5% to about 20% by weight binder, from about 0.5% to about 10%, from about 0.5% to about 8% by weight binder or from about 2% to about 8% by weight binder. The composition may include from about 5.4% to about 6.8% by weight binder. In some embodiments, the composition does not include a binder. The composition may include more than one binder with the total weight fraction of binder in the composition being as described above.

The coating composition may include a dispersant. Generally, the dispersant acts to prevent the silicon nitride particulate from settling prior to application of the coating composition to the crucible body. Suitable dispersants generally do not contribute metallic impurities to the coating composition and are clean burning and decompose during a thermal cycle. The combination of plasticizer (described below) and dispersant may be chosen such that drying of the coating without cracking or with minimal cracking is realized. In some embodiments, the dispersant is a methyloxirane polymer such as SOLSPERSE® 20000 (Lubrizol Corp., Wickliffe, Ohio). The composition may include at least about 0.05% by weight dispersant and, in other embodiments, at least about 0.1%, at least about 0.5%, at least about 1% or even at least about 5% by weight dispersants. In various other embodiments, the composition includes from about 0.05% to about 10% by weight dispersant, from about 0.05% to about 5% or from about 0.5% to about 2.5% by weight dispersant. The composition may include from about 1.6% to about 2.1% by weight dispersant. In some embodiments, the composition does not include a dispersant. The composition may include more than one dispersant with the total amount of dispersant in the composition being as described above.

The coating composition may include a plasticizer. Suitable plasticizers generally do not contribute metallic impurities to the coating composition and are clean burning and decompose during a thermal cycle. Plasticizers and dispersant may be chosen such that drying of the coating without cracking or with minimal cracking is realized. The plasticizer may be, for example, polyethylene glycol. Polyethylene glycol is commercially available as CARBOWAX® 400 (Dow Chemical Co., Midland, Mich.). The coating composition may include at least about 0.5%, at least about 2%, at least about 5%, at least about 10% or even at least about 15% by weight plasticizer. In various embodiments, the composition includes from about 0.5% to about 20% by weight plasticizer, from about 0.5% to about 10%, from about 0.5% to about 8% or from about 2% to about 8% by weight plasticizer. The composition may include from about 5.4% to about 6.8% by weight plasticizer. In some embodiments, the composition does not include a plasticizer. The composition may include more than one plasticizer with the total amount of plasticizer in the composition being as described above.

The composition may include one or more sintering aids, such as for example, yttria, silica and/or alumina. The sintering aid may be in particulate form and may be suspended in one or more mediums. The sintering aid (and in particular yttria) strengthens the coating once applied to the crucible body and generally improves adherence of silicon nitride particles to the crucible body and to each other. The coating composition may include at least about 0.1% by weight sintering aid (or sintering aids when more than one is used), at least about 0.5%, at least about 1%, at least about 5% or at least about 7.5% by weight sintering aid(s).

The mass ratio of sintering agent to silicon nitride may be at least about 1:20 and, in other embodiments, is at least about 1:10, at least about 1:5, at least about 2:5, at least about 3:5 at least about 4:5 or even at least about 1:1. In various other embodiments, the ratio of sintering agent to silicon nitride is from about 1:20 to about 1:1 or from about 1:5 to about 1:2.

In embodiments wherein the coating composition comprises yttria, the coating composition may contain at least about 0.1% by weight yttria and, in other embodiments, may contain at least about 0.5% yttria, at least about 1% yttria, at least about 5% yttria, at least about 7.5% yttria, or even at least about 12% by weight yttria. In various other embodiments, the coating composition includes from about 0.1% to about 40% by weight yttria, from about 1% to about 40% by weight yttria or from about 1% to about 20% by weight yttria.

Alternatively or in addition to yttria, the composition may include other components which may act as sintering aids, such as silica and/or alumina. In some embodiments, the composition includes at least about 0.1% by weight silica and, in others, at least about 0.5%, at least 1% or at least about 3% by weight silica. In various embodiments, the composition includes from about 0.1% to about 10% by weight silica, from 0.1% to about 5% silica or from about 1% to about 5% silica. Alternatively or in addition, the composition may include at least about 0.1% by weight alumina. In other embodiments, the composition includes at least about 0.5% by weight alumina, at least about 1% or at least about 2% by weight alumina. In various embodiments, the composition includes from about 0.1% to about 10% by weight alumina, from 0.1% to about 4% alumina or from about 1% to about 5% alumina. Generally, yttria, silica, alumina or other oxides are used as a sintering aid to increase the strength and adherence of the silicon nitride coating.

It should be noted that the amount of medium may be increased in compositions containing relatively higher amounts of oxides and, particularly, that contain relatively higher amounts of silica and alumina. Compositions with relatively higher amounts of medium are generally characterized by improved fluidity (see Example 1).

Methods for Coating a Crucible

The coating compositions described in the present disclosure may be applied to at least a portion of the inner surface of a crucible body by chemical vapor deposition, plasma spraying, brushing, aerosol spraying, pouring or any combination of these. Typically, the application is done under a ventilated hood at atmospheric pressures and at a temperature below the flash point of the coating composition. The coating composition may be applied in a single application or multiple times to reach a desired thickness. Once the desired thickness is reached, the coated crucible may be heated to vaporize the binder, medium, dispersant and the like and to leave behind silicon nitride and any oxide additive (e.g., yttria, silica, alumina and the like) as the coating. The crucible may also be sintered to cause densification and strengthening of the coating. It should be noted that in embodiments wherein multiple applications are used, the crucible may be dried, heated and/or sintered after one or more of the intermediate applications in addition to the final application.

Generally, the coating compositions herein described may be applied alone or in combination to at least a portion of the inner surface of the sidewall of the crucible or the entire inner surface of the sidewall of the crucible. If the crucible includes more than one sidewall, the coating composition may be applied to at least a portion of the inner surface of one or more sidewalls or the entire surface of one or more sidewalls and may be applied to the entire inner surfaces of all the sidewalls.

Figure 2:
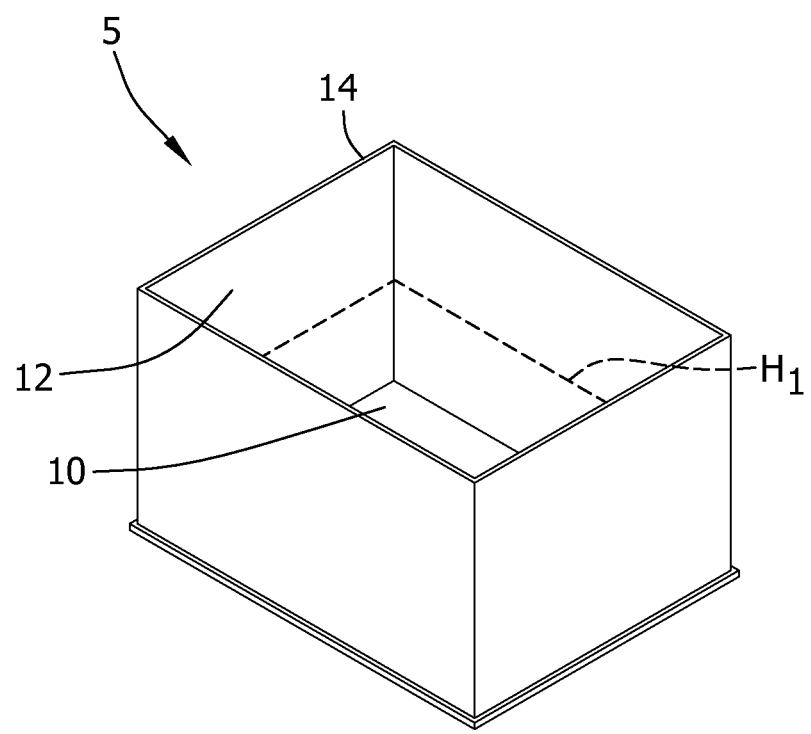
FIG. 2 is a perspective of a crucible according to one embodiment with height, $H_1$ shown.

As shown in FIG. 2, for example, the coating may be applied from the bottom of the crucible to a height, $H_1$. The distance between the bottom of the crucible and $H_1$ may be at least about 50% of the height of the sidewall. In other embodiments, the distance between the bottom of the crucible and $H_1$ is at least about 70% of the height of the sidewall or even at least about 85% of the height of the sidewall. In some embodiments, $H_1$ extends above about a solidification line, $S_1$, described below (FIG. 3) and, in other embodiments, to about the top of the crucible.

Generally, the volume of semiconductor materials and the proportional height of the material within the crucible may vary as the semiconductor material solidifies in the crucible. For instance, silicon increases in volume as it solidifies. The "solidification line" of the inner surface of the crucible extends the circumference of the inner surface of the sidewall (or sidewalls if the crucible has more than one sidewall) and corresponds to the expected portion of the crucible adjacent the top of a solidified ingot or the expected elevation of the top of the ingot. The distance between the bottom of the crucible and the solidification line corresponds to the distance between the bottom of the crucible and the top of an ingot solidified within the crucible and, when the bottom of the crucible is not uniform in dimension (such as, for example, a concave-bottomed crucible), the distance from the bottom of the crucible at a point where it meets the sidewall to the top of the solidified ingot.

Figure 3:
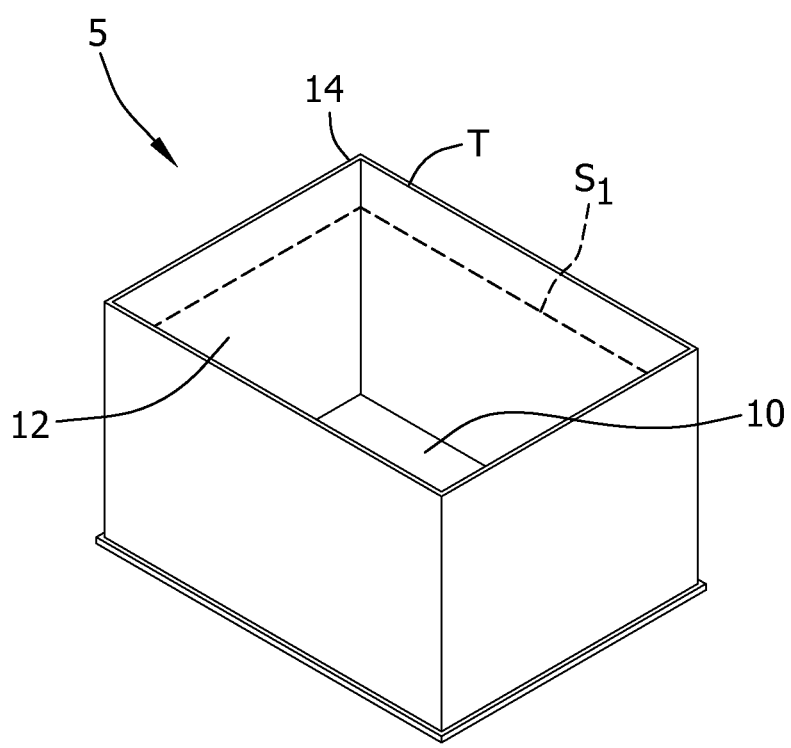
FIG. 3 is a perspective of a crucible body according to one embodiment with the solidification line, $S_1$, and top, T, shown.

The bottom 10, top, T, and solidification line, $S_1$, are generally illustrated in FIG. 3. Generally, the distance between the solidification line, $S_1$, and the top, T, of the crucible sidewall is less than about 25% of the height of the sidewall (i.e., about 25% of the distance between where the sidewall meets the bottom of the crucible and the top of the sidewall) in order to maximize the size of the solidified ingot. In other embodiments, this distance is less than about 15% of the sidewall height, less than about 10% or even less than about 5% of the height. In some embodiments, this distance is from 0.5% to about 25% of the sidewall height.

The inner surface of the crucible may be coated with coating compositions of embodiments of the present disclosure across the inner surface of the bottom of the crucible and the inner surface of the sidewall from the bottom of the crucible to at least the solidification line and, in other embodiments, to a distance above the solidification line. The distance above the solidification line to which the inner sidewall is coated may be at least about 0.5% of the height of the sidewall, at least about 1% of the height of the sidewall or even at least about 3% of the height of the sidewall.

According to some embodiments of the present disclosure, a first coating composition is applied to a first area of the inner surface of the crucible sidewall and a second coating composition is applied to a second area of the inner surface of the sidewall. For instance, two coating compositions may be applied to different portions of the crucible sidewall with one coating composition being applied to the portions of the sidewall to which the ingot is relatively more likely to adhere and the other coating composition being applied to the other areas of the sidewall. The second coating composition may contain an additive that it not present in the first coating composition. According to some embodiments, the first coating includes a medium, silicon nitride, dispersant and a binder. In addition or alternatively, the second coating composition may include a medium, silicon nitride, and an oxide additive such as alumina, silica and yttria and/or other oxides (e.g., lanthanides). The silicon nitride and/or oxide additive may be suspended in the medium.

Figure 4:
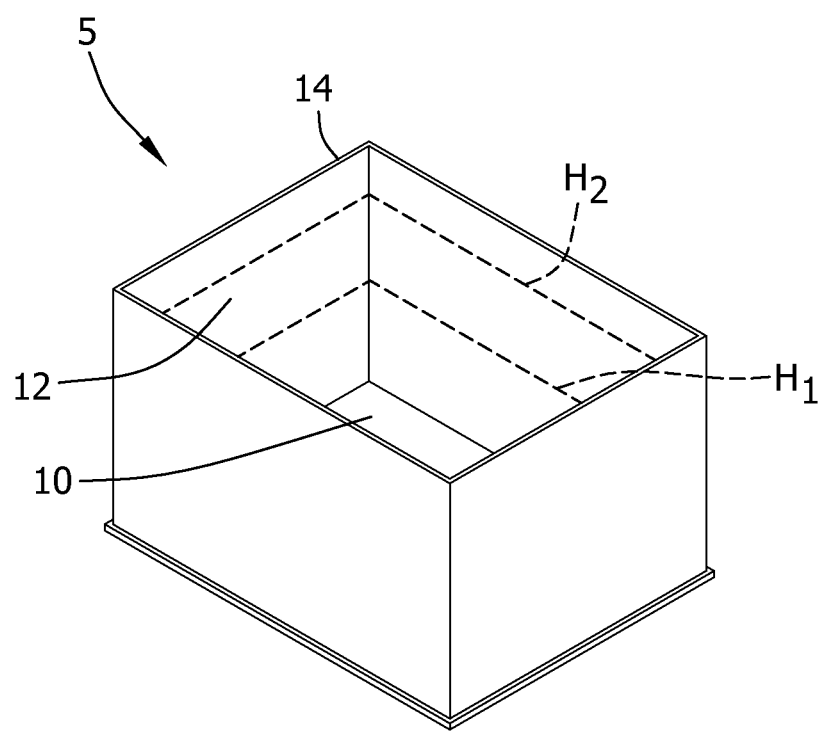
FIG. 4 is a perspective of a crucible according to one embodiment with heights, $H_1$ and $H_2$ shown.

In various embodiments and as shown in FIG. 4, the first composition may be applied to the inner surface of the sidewall from the bottom 10 of the crucible 5 to a height $H_1$ and the second coating composition may be applied to the inner surface of the crucible from about $H_1$ to a height $H_2$. The distance between the bottom of the crucible and $H_1$ may be at least about 50% of the height of the sidewall and, in other embodiments, is at least about 70% or even at least about 85% of the height of the sidewall. The distance between the bottom of the crucible and the height $H_2$ to which the second coating composition may be applied may be at least about 60% of the height of the sidewall (for instance when $H_1$ is less than about 60% of the height of the sidewall), at least about 75% (for instance when $H_1$ is less than about 75% of the height of the sidewall) or even at least about 90% of the height of the sidewall (for instance when $H_1$ is less than about 90% of the height of the sidewall). In other embodiments, $H_2$ extends above the solidification line, $S_1$, or even extends to about the top, T, of the crucible (FIG. 3).

In some embodiments, the first coating composition and the second coating composition may be applied to overlapping portions of the crucible sidewall. For instance, the first coating may be applied from the bottom 10 of the crucible 5 to a height $H_1$ and the second coating composition may be applied to a height below $H_1$ to a height $H_2$ with the distance between the bottom of the crucible and $H_1$ and $H_2$ being as described previously. In these embodiments, $H_1$ may even extend to or above the solidification line, $S_1$, or even extend to about the top, T, of the crucible.

In embodiments where the second coating composition contains yttria or other oxides and the first coating composition does not contain such additives, by limiting the amount of silicon-wetted surface area to which the second composition is applied, the total oxygen content of the coating may be reduced with a proportional reduction in the amount of oxygen in the solidified ingot. Generally, the first composition which, in some embodiments, does not contain oxide additives (e.g., yttria, silica and/or alumina and the like) may be applied to the bottom of the crucible.

Once a coating composition is applied to a portion of the inner surface of the crucible, the composition may be dried to vaporize the medium. Generally, the crucible may be dried under any atmosphere including, for example, ambient air, nitrogen, argon or mixtures thereof. Generally when ambient air is utilized, a substantial portion if not all of the medium vaporizes after about 20 minutes and, in other embodiments, after about 30 minutes or even after 40 minutes. By increasing ventilation (e.g., by the use of circulating air), drying times may be proportionally decreased. Generally, the coating is dried when the coating does not adhere or transfer material to human fingers upon contact with the coating.

The coating composition may be applied and dried several times to increase the thickness of the coating. Each application may be air-dried to remove the medium before application of another coat. Alternatively or in addition, heating may be utilized as described in more detail below. In some embodiments, the coating composition is applied and dried at least about 2 times and in other embodiments, at least about 4 times or even about 8 times. In various embodiments, the coating composition is applied until a thickness of at least about 50 μm is achieved and, in other embodiments, at least about 100 μm, at least about 250 μm, at least about 500 μm or even at least about 750 μm. In several embodiments, the coating composition is applied until a thickness of from about 50 μm to about 1000 μm, from about 100 μm to about 750 μm or from about 250 μm to about 750 μm is achieved. Generally, increased thickness of the coating result in decreased oxygen content in resulting ingots, particularly, if the coating composition itself contains minimal amounts of oxygen.

After the desired thickness is achieved (or thicknesses if more than one range of thickness is desired on the inner surface of the crucible), the crucible may be heated to a temperature sufficient to remove any binder, dispersant, plasticizer and the like. Generally, heating may be achieved by heating the crucible with the applied coating composition until the desired temperature is achieved. The binder, dispersant and/or plasticizer may be removed until the coating contains less than 5% by weight residual carbon or less than about 3% or less than about 1% by weight residual carbon. In some embodiments, the crucible is heated to at least about 150° C., to at least about 200° C., to at least about 300° C., to at least about 400° C. or even to at least about 750° C. to remove any binder, plasticizer and dispersant compounds. In various other embodiments, the crucible may be heated to from about 100° C. to 750° C. or from 400° C. to 750° C. The crucible may be heated for at least about 1 hour and, in other embodiments, at least about 2 hours, at least about 3 hours or from about 1 hour to about 5 hours. In some embodiments, the crucible is heated to at least about 300° C. for at least about 2 hours. The atmosphere may be at a pressure (vacuum) of from about 60 torr (0.08 atm) to about 1 atmosphere or from about 150 torr (0.20 atm) to about 1 atmosphere. In other embodiments, pressures above atmospheric are used such as, for example, pressures of at least 1 atmosphere, at least 2 atmospheres or even at least 5 atmospheres.

The crucible may be heated in the presence of an inert gas such as, for example, nitrogen, helium or argon. Ambient air may also be used as the atmosphere during heating but is less preferred as it may introduce oxygen into the coating. Further, the materials of construction of the furnace as well as the gas flows may be controlled to avoid oxidation of the coating as appreciated by those of skill in the art.

In addition or alternatively to the crucible heating, the crucible may also be sintered to densify the coating. In embodiments wherein the crucible is heated to remove any residual medium and the binders and plasticizers as described above, sintering may be performed after the removal of any residual medium, solvent, binder and/or plasticizer or the sinter may additionally be used to remove one or more of these components. In certain embodiments, sintering is performed during meltdown of a silicon charge to minimize processing time. To achieve sintering, the crucible may be heated to a temperature of at least about 1000° C. and, in another embodiment, at least about 1100° C. The crucible may be sintered for at least about 1 hour and, in other embodiments, at least about 2 hours, at least about 3 hours or from about 1 hour to about 5 hours. In some embodiments, the crucible is sintered at a temperature of at least about 1100° C. for at least about 3 hours. The crucible may be sintered in the presence of an inert gas such as, for example, nitrogen, helium or argon. The atmosphere may be at a pressure (vacuum) of from about 60 torr (0.08 atm) to about 1 atmosphere or from about 150 torr (0.20 atm) to about 1 atmosphere. In other embodiments, pressures above atmospheric are used such as, for example, pressures of at least 1 atmosphere, at least 2 atmospheres or even at least 5 atmospheres. The residual carbon levels left on the crucible after different heating and/or sintering treatments were tested in Example 6 below.

When one or more coating compositions are applied to the inner surface of the crucible sidewall, the second composition which may include oxide additives (yttria, silica, alumina and the like) may be applied to the second area of the crucible and dried. This may be repeated until the desired thickness is achieved. The first composition that does not contain additives may then be applied to the first area of the crucible and dried. The first composition may be applied and dried repeatedly to achieve the desired thickness. The first coating and second coating after applied and/or after dried may overlap each other over a portion of the inner surface of the crucible without departing from the scope of the present disclosure.

Coated Crucibles

As discussed above, the coating composition is applied to a portion or all of the inner surface using one or more applications and the coating composition may be dried in various methods depending on the type and number of coatings applied and the desired composition of the resulting coating. In general, by drying the crucible at ambient temperatures the medium vaporizes to leave behind the silicon nitride and a portion of the binder, plasticizer, dispersant and/or oxide additives (yttria, silica, alumina and the like). By heating the crucible, the residual binder, plasticizer and/or dispersant may be vaporized leaving behind silicon nitride, any oxide additives and residual carbon. As shown in Example 6, by heating the crucible to 400° C. for at least 2 hours, the residual carbon concentration in the coating may be reduced to less than 1% by weight of the coating.

In some embodiments including embodiments wherein the coating composition used to coat a portion of the crucible does not contain an oxide additive, the crucible coating may include at least about 90% by weight silicon nitride. In other embodiments, the coating includes at least about 95% by weight silicon nitride or even at least about 97.5% by weight silicon nitride. The coating may include less than about 1% by weight carbon. It should be noted that the coating compositions described in this section entitled "Coated Crucibles" refer to compositions of the coating after a heating step (e.g., heating to at least about 300° C.) and, optionally, a sintering step as described above in the section above entitled "Methods for Coating a Crucible."

In various embodiments, the coating extends over the entire inner surface of the crucible sidewall (and in some embodiments sidewalls) or a portion of the inner surface of the sidewall. As described above in relation to the area to which coating compositions may be applied and as shown in FIG. 2, the coating may extend across the inner surface of the bottom of the crucible and the inner surface of the sidewall from the bottom of the crucible to a height, $H_1$.

In some embodiments, the coating that covers a first area of the crucible sidewall may include silicon nitride and an amount of a sintering agent (e.g., an oxide additive such as yttria, silica or alumina). In such embodiments, the coating may include at least about 40% by weight silicon nitride, at least about 60% silicon nitride or even at least about 80% by weight silicon nitride in addition to sintering agent.

The coating may include at least about 0.5% by weight yttria. In other embodiments, the coating may include at least about 1% by weight yttria, at least about 5%, at least about 10%, at least about 15% or even at least about 20% by weight yttria. In various embodiments, the coating includes from about 0.5% to about 25% by weight yttria, from about 0.5% to about 20% by weight, from about 0.5% to about 10% by weight or from about 1% to about 20% by weight yttria. The mass ratio of yttria to silicon nitride in the coating may be at least about 1:20 and, in other embodiments, at least about 1:10, at least about 2:5 or even at least about 4:5.

Alternatively or in addition, oxide additives other than yttria such as silica and/or alumina may be present in the coating. Other suitable oxide additives may include lanthanide oxides. In some embodiments the coating comprises at least about 0.5% by weight silica. In other embodiments, the coating may include at least about 1% by weight silica, at least about 5%, at least about 10%, at least about 15%, or even at least about 20% by weight silica. In various other embodiments, the coating comprises from about 0.5% to about 25% by weight silica, from about 0.5% to about 20% by weight, from about 0.5% to about 10% by weight or from about 1% to about 20% by weight silica.

The crucible coating may include an amount of alumina and, in some embodiments, contains at least about 0.5% by weight alumina. In other embodiments, the coating includes at least about 1% by weight alumina, at least about 5% or even at least about 10% by weight alumina. In various other embodiments, the coating comprises from about 0.5% to about 25% by weight alumina, from about 0.5% to about 20% by weight, from about 0.5% to about 10% by weight or from about 1% to about 20% by weight alumina.

In particular embodiments, the coating on the inner surface of the crucible sidewall may consist essentially of silicon nitride, sintering agent (e.g., yttria, silica or alumina) and carbon. The amount of carbon in the coating may be less than about 1% by weight carbon.

Coated crucibles of the present disclosure may include more than one coating applied to the inner surface of the crucible sidewall. The crucible may include a first coating on a first area of the inner surface of the sidewall and a second coating on a second area of the inner surface of the sidewall. In some embodiments, the second coating comprises an additive not present in the first coating such as, for example, yttria. Alternatively or in addition, the first coating may include an additive not present in the second coating.

Coatings containing sintering agent (e.g., yttria, silica or alumina) may be applied to the entire inner surface of the crucible sidewall or may be applied to a portion of the sidewall (for instance between $H_1$ and $H_2$ as shown in FIG. 4). Such coatings provide improved ingot-release characteristics so it may be desirable to apply the coatings to the portion of the crucible where improved ingot-release characteristics are desirable, typically the portion near the top of the sidewall in upward directional solidification applications. However, it should also be noted that such coatings may introduce oxygen into the ingot. As such, it may also be desirable to minimize the use of such coatings. The amount and location of such coating may be determined based on the desired release characteristics and ingot oxygen content.

As described above in relation to application of the first and second coating compositions and with reference to FIG. 4, the first coating may extend from the bottom of the crucible to a height $H_1$ and the second coating may extend from about $H_1$ to a height $H_2$. When the coated crucible contains two coatings, the first coating may include silicon nitride and may include residual carbon left from any binder, plasticizer, dispersant and the like. The first coating may include less than about 1% by weight carbon. The first coating may even consist essentially of silicon nitride and carbon.

The second coating may include silicon nitride and sintering agent (e.g., yttria, silica or alumina). The second coating may include at least about 40% by weight silicon nitride, at least about 60% or at least about 80% by weight silicon nitride. The mass ratio of sintering agent to silicon nitride in the second coating may be at least about 1:20, at least about 1:10, at least about 2:5, or even at least about 4:5. The second coating may include at least about 0.5% by weight yttria or at least about 1%, at least about 5%, at least about 10%, at least about 15% or even at least about 20% by weight yttria. In some embodiments, the second coating includes from about 0.5% to about 25% by weight yttria.

The second coating may include an amount of silica and, in some embodiments, includes at least about 0.5% by weight silica, at least about 1%, at least about 5%, at least about 10%, at least about 15%, at least about 20% or from about 0.5% to about 25% by weight silica. The second coating may also include an amount of alumina and, in some embodiments, includes at least about 0.5% by weight alumina, at least about 1%, at least about 5%, at least about 10% or from about 0.5% to about 25% by weight alumina.

The second coating may include silicon nitride and any combination of sintering agents (e.g., any combination of yttria, silica and alumina). The second coating may consist essentially of silicon nitride, sintering agent and carbon.

In embodiments where only one coating is applied to the inner surface of the crucible sidewall or even when multiple coatings are applied, the thickness of any or even all of the coatings if more than one may correspond to the thicknesses described above.

Methods for Preparing an Ingot

One aspect of the disclosure relates to preparation of silicon ingots and, particularly, to preparation of silicon ingots. In embodiments where multicrystalline silicon ingots produced by a directional solidification process are desired, polycrystalline silicon may be loaded into a coated crucible to form a silicon charge. Coated crucibles to which polycrystalline silicon may be applied are generally described above. Methods for crystallizing are generally described by K. Fujiwara et al. in *Directional Growth Medium to Obtain High Quality Polycrystalline Silicon from its Melt*, Journal of Crystal Growth 292, p. 282-285 (2006), which is incorporated herein by reference for all relevant and consistent purposes.

Once loaded into the coated crucible of the present disclosure, the silicon charge may be heated to a temperature above about the melting temperature of the charge to form a silicon melt. The silicon charge may be heated to at least about 1410° C. to form the silicon melt and, in another embodiment, at least about 1450° C. to form the silicon melt. Once the silicon melt has been prepared, the melt may be solidified such as, for example, in a directional solidification process. The ingot may then be cut into one or more pieces with dimensions matching several of the dimensions of a desired solar cell. Wafers may be prepared by slicing these pieces by, for example, use of a wiresaw to produce sliced wafers.

The multicrystalline silicon produced by directional solidification is an agglomeration of crystal grains with the orientation of the grains relative to each other being random due to the high density of heterogeneous nucleation sites at the crucible wall. The resulting multicrystalline silicon ingot may have an average nominal crystal grain size of from about 1 mm to about 15 mm and, in other embodiments, has an average nominal crystal grain size of from about 5 mm to about 25 mm or from about 5 mm to about 15 mm.

Silicon wafers may be produced by slicing the ingot using, for example, a wiresaw. The resulting silicon wafers have average nominal crystal grain sizes as described above for multicrystalline ingots.

Ingots with Low Oxygen Content

Generally, it has been found that by utilizing a crucible with a coating of sufficient thickness that contains minimal sources of oxygen (i.e., yttria, silica, alumina and the like) and by utilizing C1 to C10 alcohol mediums in coating compositions rather than water and, optionally, by sintering these coatings in an inert atmosphere, resulting multicrystalline ingots and wafers are characterized by a reduced oxygen content and proportionally reduced light induced degradation.

Figure 5:
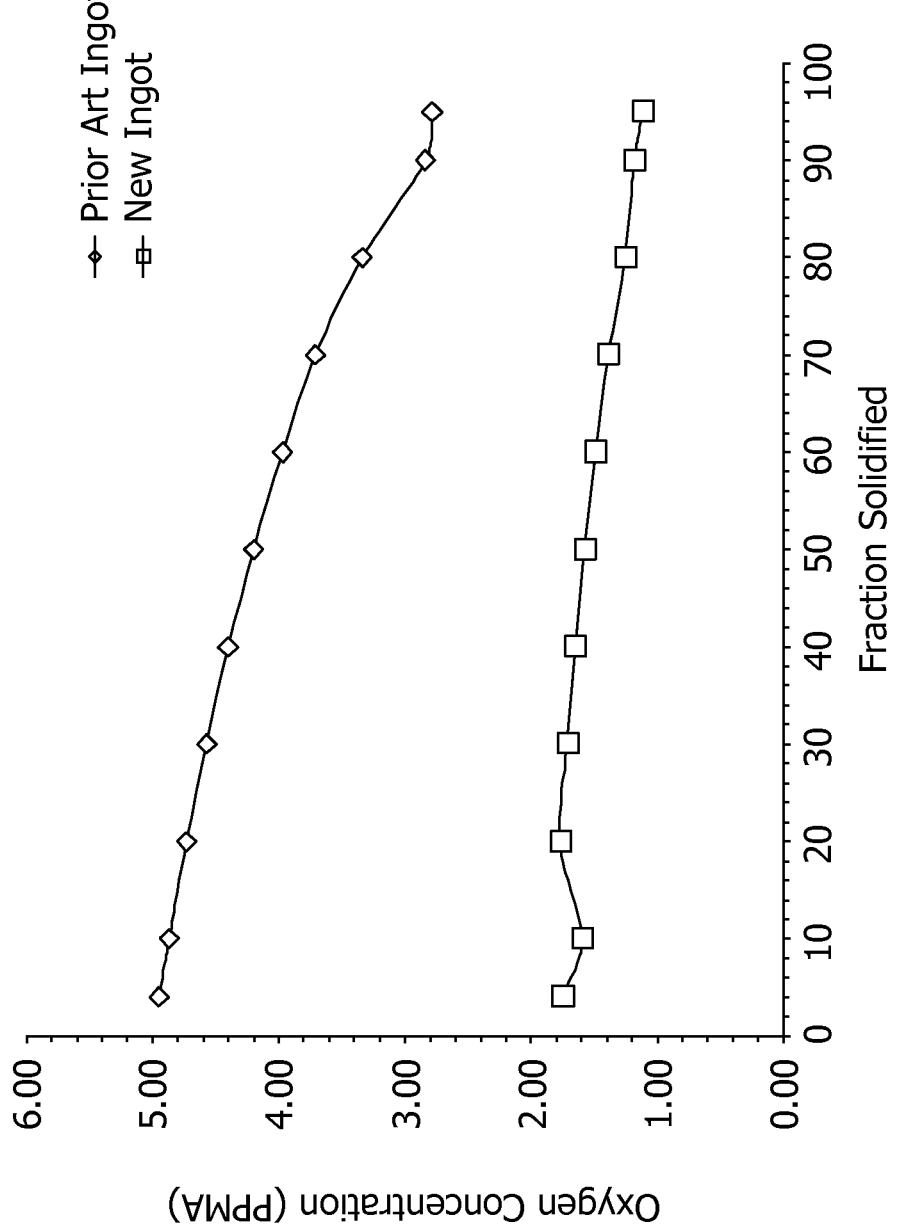
FIG. 5 is a graphical illustration comparing the oxygen concentrations along the height of a conventionally prepared crucible and a crucible prepared by the process of one embodiment of the present disclosure.

Referring now to FIG. 5, ingots prepared according to the present disclosure, that is by utilizing a silicon nitride coating in an alcohol medium with a binder and dispersant, contained less oxygen across all fractions of the ingot (i.e., from top to bottom).

Silicon ingots according to embodiments of the present disclosure may have a bottom, a top and a height, $H_3$, wherein $H_3$ corresponds to the average distance between the bottom and top of the ingot. As shown in FIG. 5, the oxygen concentration in the as grown ingot may generally decrease from the bottom of the ingot to the top of the ingot, wherein the top and bottom of the ingot correspond to the top and bottom as grown in the crucible. It should be noted in this regard that the oxygen concentration profile as described herein refers to the concentration profile of an as grown multicrystalline ingot. In this regard, the ingot may be free of cut marks exhibited by ingots that have been cut by a wiresaw or otherwise. The bottom and top of the ingots as described herein correspond to the bottom and top of the ingots after solidification. This allows the ingots to be characterized by an oxygen concentration along the height of the ingot as solidified.

The silicon ingot may be produced by a directional solidification process as described above. The ingot may contain multicrystalline silicon with the average nominal crystal grain size being from about 1 mm to about 15 mm. In other embodiments, the average nominal crystal grain size is from about 5 mm to about 25 mm or from about 5 mm to about 15 mm.

In some embodiments, the oxygen concentration of the ingot at a height about 20% of $H_3$ is less than about 4.5 ppma. In other embodiments, the oxygen concentration of the ingot at a height about 20% of $H_3$ is less than about 4.0 ppma, 3.0 ppma or even 2.0 ppma. The oxygen concentration of the ingot between a height about 20% of $H_3$ to a height about 80% of $H_3$ may be less than about 3.0 ppma and, in other embodiments, is less than about 2.0 ppma. In one particular embodiment, the oxygen concentration of the ingot between the bottom and the top is less than about 2.5 ppma and, in another embodiment, less than about 2.0 ppma.

Generally, oxygen content may be measured using Fourier Transform Infrared Spectophotometry (FTIR). For example, the oxygen concentration may be measured by cutting 2 mm thick slugs of silicon from the ingot at the height of interest and measuring the oxygen content by FTIR.

Generally, the shape of the ingot corresponds to the crucible in which it was solidified and, in some embodiments, the ingot is rectangular or even square in shape.

Wafers with Low Oxygen Content

As can be seen from FIG. 5, the oxygen concentrations along the entire height of the ingot of the present disclosure are less than the lowest oxygen concentration exhibited by the conventional ingot. Accordingly, wafers produced along the entire height of the ingot will exhibit a lower oxygen content that all wafers produced from the conventional ingot. In some embodiments of the present disclosure, a silicon wafer has an oxygen concentration of less than about 2.5 ppma. In other embodiments, the silicon wafer has an oxygen concentration of less than about 2.25 ppma, of less than about 2 ppma, of less than about 1.75 ppma, of less than about 1.5 ppma or even less than about 1.25 ppma. In various other embodiments, the wafer has an oxygen content of from about 0.1 to about 3 ppma, from about 0.5 to about 3 ppma, from about 0.75 to about 3 ppma, from about 1 to about 3 ppma, from about 0.75 to about 2.5 ppma, from about 0.75 to about 2.25 ppma, from about 0.75 to about 2 ppma or from about 0.75 to about 1.75 ppma.

The wafer may contain multicrystalline silicon. The average nominal crystal grain size may be from about 1 mm to about 15 mm, from about 5 mm to about 25 mm or from about 5 mm to about 15 mm. In some embodiments, the wafer is rectangular (including square wafers). The wafer may be characterized by any shape without departing from the scope of the present disclosure.

EXAMPLES

Example 1

Coating a Crucible with a Silicon Nitride Coating Composition

The coating composition of Table 1 below was prepared by weighing out the amount of isopropyl alcohol in a sufficiently large beaker. The amounts of dispersant (SOLSPERSE® 20000), binder (PVB (B-76)), plasticizer (PEG (CARBOWAX® 400)) and silicon nitride powder were weighed out separately. The beaker and medium were placed onto a hot plate. A high shear impeller type mixer was placed into the fluid. The beaker was capped to minimize loss by evaporation. The medium was warmed to a temperature between 60 to 80° C. while stirring. The PVB was added and stirred until the binder broke down and the fluid became a tacky viscous fluid. After mixing (about 15 minutes) the fluid color achieved a more clear state.

Dispersant and PEG were added to the stirred fluid while stirring. The hot plate was turned off and the mixture was stirred for 5 minutes. The contents were poured while warm into a polyethylene container. Silicon nitride milling balls (10 mm in diameter) were added to the container for milling. A polyethylene lid was screwed onto the open end of the container to minimize leakage of the mixture or evaporation of the medium.

The milling container was opened and the pre-weighed silicon nitride powder was added. The container was closed and placed onto a milling apparatus that turned at a speed of 60 rpm. The mixture was milled for 6 hours to ensure thorough mixing.

The composition was then used to coat the inner surface of a silica crucible (68 cm×68 cm×42 cm). The slip was brushed onto the surface using a foam applicator common to paint application. The composition was first applied in the corners and then applied to the vertical walls and then the bottom of the crucible. Any puddling or dripping was brushed out before appreciable medium evaporated and skinned the surface of the drip. The composition was allowed to dry for about 30 to 45 minutes in air at room temperature in a ventilated area. The composition was applied three more times with drying in-between to build up a four-pass coating.

The binder, dispersant and plasticizer were removed by heating to a temperature between 300 to 400° C. for two hours. The crucible was then heated to a temperature of 1100° C. for three hours to sinter the coating. The thickness of the coating was 400 μm before sintering and from 290 μm to 325 μm after sintering. A silicon charge of 270 kg was added to the coated crucible and directionally solidified. The solidified ingot released well from the crucible.

TABLE 1

Percentage Inclusion by Weight of Components of the Coating Composition of Example 1

| Component | Percentage Inclusion (wt %) |
|---|---|
| Silicon Nitride | 37.5 |
| Dispersant (SOLSPERSE ® 20000) | 1.8 |
| Medium (isopropyl alcohol) | 49.5 |
| Binder (PVB (B-76)) | 5.6 |
| Plasticizer (PEG (CARBOWAX ® 400)) | 5.6 |

Example 2

Coating a Crucible with a Silicon Nitride Coating Composition that Contains Yttria Compositions 1-3 shown in Table 2 were prepared with increasing amounts of yttria. The portions of the desired mixture were weighed out taking into account the desired silicon nitride to additive mass ratio. The silicon nitride and yttria were mixed and the medium was added followed by additions of the dispersant, PVB and PEG. The mixture was mechanically mixed for five minutes.

TABLE 2

Percentage Inclusion by Weight of Components of the Coating Compositions of Example 2

| Component | Composition 1 (wt %) | Composition 2 (wt %) | Composition 3 (wt %) |
|---|---|---|---|
| Silicon Nitride | 36.14 | 34.88 | 32.61 |
| Dispersant (SOLSPERSE ® 20000) | 1.73 | 1.67 | 1.57 |
| Medium (isopropyl alcohol) | 47.71 | 46.05 | 43.04 |
| Binder (PVB (B-76)) | 5.40 | 5.21 | 4.87 |
| Plasticizer (PEG (CARBOWAX ® 400)) | 5.40 | 5.21 | 4.87 |
| Yttria | 3.61 | 6.98 | 13.04 |

The compositions were then used to coat the inner surface of several crucibles. Each composition was brushed onto a silica crucible to achieve a 400 μm thickness. The coated-crucible was heated to 400° C. for three hours and was then heated to 1100° C. for four hours. A 60 torr argon gas atmosphere was used during heating. Not taking residual carbon into account, the coating contained silicon nitride and yttria in the amounts shown in Table 3.

TABLE 3

Percentage Inclusion by Weight of Components of the Coating of Example 2

| Component | Composition 1 (wt. %) | Composition 2 (wt. %) | Composition 3 (wt. %) |
|---|---|---|---|
| Silicon Nitride | 90.9 | 83.3 | 71.4 |
| Yttria | 9.1 | 16.7 | 28.6 |

Increasing the concentration of yttria improved bonding of the coating to the crucible. The coating produced from Composition 3 was found to adhere best to the crucible.

Example 3

Adjustment of the Amount of Medium to Maintain Fluidity

Compositions A-D shown in Table 4 were prepared with increasing amounts of silica, alumina and yttria. The compositions were prepared and applied to a crucible as described in Example 2. The amount of dispersant was increased in each composition until the composition was characterized by sufficient fluidity.

TABLE 4

Percentage Inclusion by Weight of Components of the Coating Compositions of Example 3

| Component | Composition A (%) | Composition B (%) | Composition C (%) | Composition D (%) |
|---|---|---|---|---|
| Silicon Nitride | 34.04 | 22.42 | 18.01 | 14.53 |
| Dispersant (SOLSPERSE ® 20000) | 1.63 | 1.08 | 0.86 | 0.70 |
| Medium (isopropyl alcohol) | 50.30 | 59.63 | 63.49 | 67.25 |
| Binder (PVB (B-76)) | 5.08 | 3.35 | 2.69 | 2.17 |
| Plasticizer (PEG (CARBOWAX ® 400)) | 5.08 | 3.35 | 2.69 | 2.17 |
| Silica | 1.37 | 3.61 | 4.35 | 4.68 |
| Alumina | 0.77 | 2.04 | 2.46 | 2.65 |
| Yttria | 1.72 | 4.52 | 5.45 | 5.86 |

The compositions were then used to coat a portion of the inner surface of several silica crucibles to a thickness of 100 nm. The coated-crucible was heated to 400° C. for three hours and was then heated to 1100° C. for four hours. A 60 torr argon gas atmosphere was used during heating. Not taking residual carbon into account, the coating contained silicon nitride, yttria, silica and alumina in the weight percentages shown in Table 5.

TABLE 5

Percentage Inclusion by Weight of Components of the Coating of Example 3

| Component | Composition A (wt %) | Composition B (wt %) | Composition C (wt %) | Composition D (wt %) |
|---|---|---|---|---|
| Silicon Nitride | 89.8 | 68.8 | 59.5 | 52.4 |
| Silica | 3.6 | 11.1 | 14.4 | 16.9 |
| Alumina | 2.0 | 6.3 | 8.1 | 9.6 |
| Yttria | 4.5 | 13.9 | 18.0 | 21.1 |

Only the top 10% of the inner surface of the crucibles was coated with the yttria-containing composition. The remainder of the inner surface of each crucible was coated with the coating composition of Table 1.

Increasing the amounts of yttria, silica and alumina in the coating improved bonding of the coating to the crucible. The coating produced from Composition D was found to adhere best to the crucible.

Example 4

Preparation of a Coating Composition without Oxide Additives and a Coating Composition that contains an Oxide Additive (Silica)

The compositions shown in Table 6 were used as starting compositions that may be adjusted to provide the proper fluidity so as to avoid defects in the coating (e.g., to assure continuity of the coating on the crucible and to avoid pinholes). The first coating composition did not contain any oxide additives and is suitable for use on the lower potions of the crucible. The second coating composition contained silica as an additive and is suitable for use on upper portions of the crucible.

TABLE 6

Percentage Inclusion by Weight of Components of the Coating Compositions of Example 4

| Component | First Composition (%) | Second Composition (%) |
|---|---|---|
| Silicon Nitride | 21.8 | 20.9 |
| Dispersant (SOLSPERSE ® 20000) | 4.3 | 4.1 |
| Medium (isopropyl alcohol) | 64.2 | 61.6 |
| Binder (PVB (Butvar ®)) | 3.3 | 3.1 |
| Plasticizer (PEG (CARBOWAX ® 400)) | 6.4 | 6.2 |
| Silica | — | 4.2 |

Example 5

Comparison of the Oxygen Content of Commercially Available Ingots and Ingots Prepared Using Coated Crucibles of the Present Disclosure The oxygen content of a conventional multicrystalline ingot was compared against multicrystalline ingots solidified in a silica crucible coated with the composition of Table 1 and dried and sintered in an argon atmosphere and according to the third to last row of Table 7 (below). The coating was 400 µm thick. 2 mm thick samples of material cut horizontally from the bricks were taken at various solidified fractions (heights) of the ingot. Data points are interpolated by straight lines in the plots to generate the oxygen concentrations at various points along the height of the crucible as shown in FIG. 5.

Example 6

Determination of the Carbon Content of the Coating During Drying

The coating composition of Table 1 was applied to several silica crucibles and different heat treatments were applied. The results are shown in Table 7 below. Heat treatment temperatures (to remove plasticizer, binder, dispersant and the like) were achieved over a two hour ramp. Sintering temperatures were achieved over a 2 hour ramp from the burn-off temperature.

TABLE 7

Residual Carbon within a Crucible Coating after Different Heat Treatments

| Air Dried? | Heat Treatment? | Heat Treatment Temp. (° C.) | Sinter? | Sinter Temp. (° C.) | Residual Carbon (wt %) |
|---|---|---|---|---|---|
| Yes | No | — | No | — | 14.00 |
| Yes | Yes | 180 | No | — | 12.30 |
| Yes | Yes | 210 | No | — | 11.00 |
| Yes | Yes | 400 | No | — | 0.57 |
| Yes | Yes | 210 | Yes | 1100 | 0.16 |
| Yes | Yes | 300 | Yes | 1100 | 0.20 |
| Yes | Yes | 400 | Yes | 1100 | 0.24 |

As can be seen from Table 7, a heat treatment at 400° C. is generally sufficient to remove most carbon from the crucible coating.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A composition for coating the inner surface of a crucible to improve an ingot-release characteristic of the crucible, the composition comprising a medium, silicon nitride, binder, dispersant, and a sintering agent.

2. A composition as set forth in claim 1 wherein the silicon nitride and sintering agent are particulates that are suspended in the medium.

3. A composition as set forth in claim 1 wherein the medium is a $C_1$ to $C_{10}$ alcohol.

4. A composition for coating the inner surface of a crucible to improve an ingot-release characteristic of the crucible, the composition comprising a medium comprising isopropyl alcohol, silicon nitride, binder, and a sintering agent.

5. A composition as set forth in claim 1 wherein the binder is polyvinyl butyral.

6. A composition as set forth in claim 1 wherein the coating composition comprises at least about 0.1% by weight yttria as a sintering agent.

7. A composition as set forth in claim 1 wherein the mass ratio of sintering agent to silicon nitride in the coating composition is at least about 1:20.

8. A composition as set forth in claim 1 wherein the coating composition comprises at least about 0.1% by weight silica as a sintering agent.

9. A composition as set forth in claim 1 wherein the coating composition comprises at least about 0.1% by weight alumina as a sintering agent.

10. A composition as set forth in claim 1 wherein the coating composition comprises at least about 5% by weight silicon nitride.

11. A composition as set forth in claim 1 wherein the coating composition comprises at least about 15% by weight silicon nitride.

12. A composition as set forth in claim 1 wherein the coating composition comprises at least about 30% by weight silicon nitride.

13. A composition as set forth in claim 1 wherein the coating composition comprises at least about 30% by weight medium.

14. A composition as set forth in claim 1 wherein the coating composition comprises at least about 0.5% by weight binder.

15. A composition as set forth in claim 1 wherein the coating composition comprises at least about 5% by weight binder.

16. A composition as set forth in claim 1 wherein the coating composition includes at least about 0.5% by weight dispersant.

17. A composition as set forth in claim 1 wherein the coating composition includes at least about 1% by weight dispersant.

18. A composition as set forth in claim 1 wherein the coating composition comprises at least about 0.5% by weight plasticizer.

19. A composition for coating the inner surface of a crucible to improve an ingot-release characteristic of the crucible, the composition comprising a medium, silicon nitride, binder, and more than one sintering agent selected from the group consisting of silica, alumina, and yttria.

20. A composition as set forth in claim 19 wherein the coating composition comprises at least about 0.1% by weight silica and at least about 0.1% by weight alumina as the sintering agent.

21. A composition as set forth in claim 19 wherein the coating composition comprises at least about 0.1% by weight silica and at least about 0.1% by weight yttria as the sintering agent.

22. A composition as set forth in claim 19 wherein the coating composition comprises at least about 0.1% by weight alumina and at least about 0.1% by weight yttria as the sintering agent.

* * * * *